(12) United States Patent
Davies

(10) Patent No.: US 6,759,746 B1
(45) Date of Patent: Jul. 6, 2004

(54) DIE ATTACHMENT AND METHOD

(76) Inventor: Robert Bruce Davies, 433 E. McKinley, Tempe, AZ (US) 85281

( * ) Notice: Subject to any disclaimer, the term of this patent is extended or adjusted under 35 U.S.C. 154(b) by 0 days.

(21) Appl. No.: 09/527,281

(22) Filed: Mar. 17, 2000

(51) Int. Cl.$^7$ ................................................ H01L 23/12
(52) U.S. Cl. ...................................... 257/731; 257/730
(58) Field of Search ................................ 257/618, 619, 257/623, 632, 633, 629, 620, 712, 706, 730, 724, 731; 7/618, 619, 623, 632, 633, 629, 620, 712, 706

(56) References Cited

U.S. PATENT DOCUMENTS

| | | | | |
|---|---|---|---|---|
| 4,286,374 A | * | 9/1981 | Hantusch | 29/580 |
| 4,859,633 A | * | 8/1989 | Bayraktaroglu | 437/211 |
| 5,207,866 A | | 5/1993 | Lue et al. | |
| 5,208,167 A | | 5/1993 | Nakamura | |
| 5,381,047 A | * | 1/1995 | Kanno | 257/777 |
| 5,478,773 A | | 12/1995 | Dow et al. | |
| 5,532,519 A | * | 7/1996 | Bertin et al. | 257/777 |
| 5,539,241 A | | 7/1996 | Abidi | |
| 5,556,808 A | * | 9/1996 | Williams et al. | 438/106 |
| 5,592,018 A | * | 1/1997 | Leedy | 257/619 |
| 5,998,868 A | * | 12/1999 | Pogge et al. | 257/730 |
| 5,998,875 A | * | 12/1999 | Bodo et al. | 257/778 |
| 6,144,221 A | * | 11/2000 | Oshima | 326/80 |
| 6,188,138 B1 | * | 2/2001 | Bodo et al. | 257/778 |
| 6,459,158 B1 | * | 10/2002 | Delprat et al. | 257/777 |

FOREIGN PATENT DOCUMENTS

| | | | |
|---|---|---|---|
| EP | 0488344 | 6/1992 | ........... H01L/21/76 |
| GB | 2156149 | 10/1985 | ........... H01L/21/76 |
| JP | 0130724 | 12/1989 | ........... H01L/21/76 |
| JP | 5343320 | 12/1993 | ........... H01L/21/20 |

OTHER PUBLICATIONS

An article entitled "Analysis, Design, and Optimization of Spiral Inductors and Transformers for Si RF IC's" by A.M. Niknejad and R.G. Meyer, IEEE JSSC vol. 33, No. 10, Oct. '98, pp. 1470–1481.

An article entitled "Integrated Passive Components in MCM–Si Technology and their Applications in RF–Systems" by J. Hartung, 1998 Intl. Conf. on Multichip Modules and High Density Packaging, IEEE Cat. No. 0–7803–4850–8/98 (Aug. '98), pp. 256–261.

An article entitled "A 1.8 GHz Low–Phase–Noise Spiral–LC CMOS VCO" by J. Craninckx and M. Steyaert, IEEE Cat. No. 0–7803–3339–X 96 (1996), pp. 30–31.

An article entitled "Applications for GaAs and Silicon Integrated Circuits in Next Generation Wireless Communication Systems" by L.M. Burns, IEE JSSC, vol. 30, No. 10, Oct. 1996, pp. 1088–1095.

An article entitled "High–Q Integrated RF Inductors on Silicon" (Prof. Abbas Ourmazed, IHP 15320. pp. 50–51 ) Annual Report 1998 of the Instut Halbleiter Physik.

* cited by examiner

Primary Examiner—David A. Zarneke
(74) Attorney, Agent, or Firm—Parsons & Goltry; Robert A. Parsons; Michael W. Goltry

(57) ABSTRACT

A method for forming a semiconductor device including a die attach surface having a first pedestal and a first semiconductor die having a first surface formed with a first cavity for mounting the first semiconductor die on the first pedestal. Further provision is made for the formation of a dielectric cavity in the semiconductor die, the first pedestal or both. The cavity allows for fields produced by electronic components disposed on the upper surface of the semiconductor die to penetrate into the dielectric cavity.

Inclusion of a second pedestal on a common die attach surface and a second semiconductor die having second cavity for mounting provides for substantially coplanar precision alignment or the first and second semiconductor die.

19 Claims, 17 Drawing Sheets

DIE ATTACHMENT AND METHOD

BACKGROUND OF THE INVENTION

1. Field of the Invention

This invention relates to a method of forming high quality factor passive components on silicon substrates and die attachment for die formed from silicon substrates.

More specifically, the present invention relates to formation of a cavity beneath a dielectric platform formed on a first surface of a silicon substrate.

In a further and more specific aspect, the present invention relates to robust heatsinking of a silicon die coupled with formation of high quality factor passive components on the silicon die.

2. Prior Art

In operation of RF integrated circuits, it is necessary to provide frequency-selective circuitry for filtering signals, amplifying selected signals with respect to other, unwanted signals and for other kinds of RF functions. As frequencies increase, the provision of frequency-selective components becomes more problematic, especially in monolithic form.

Various kinds of frequency selection components have been developed over the years. Some of these, such as crystals and SAWS, depend on mechanical resonances to provide frequency selectivity. These types of devices tend to be incompatible with silicon circuitry requirements for reasons having to do with materials engineering and also because these types of devices require different, and much more expensive, packaging than is typical for silicon circuitry.

As a result, much work has focused on attempts to provide LC frequency selection functions on silicon. However, especially the inductors tend to be difficult to form with high quality factor, also known as "Q". Additionally, the kinds of inductors that have been made tend to require large areas on the resulting integrated circuit. Some systems opt for separately-packaged frequency selection components, with the result that parts count is increased.

In an article entitled "Integrated Passive Components in MCM-Si Technology and their Applications in RF-Systems" by J. Hartung, 1998 Intl. Conf. on Multichip Modules and High Density Packaging, IEEE Cat. No. 0-7803-4850-8/98 (August '98), pp. 256–261, measured Qs and inductances for coils fabricated on silicon multichip modules are presented. In an article entitled "Applications for GaAs and Silicon Integrated Circuits in Next Generation Wireless Communication Systems" by L. M. Burns, IEEE JSSC, Vol. 30, No. 10, October 1996, pp.1088–1095, the demand for lightweight, portable communications products is addressed through monolithic integration of passive components in receivers and transmitters. These articles address system-level concerns that are met by combining separate circuits for the frequency selection functions.

Monolithic integration of inductors is also addressed in a variety of ways. For example, in an article entitled "Analysis, Design, and Optimization of Spiral Inductors and Transformers for Si RF IC's" by A. M. Niknejad and R. G. Meyer, IEEE JSSC Vol. 33, No. 10, October '98, pp. 1470–1481, design rules are discussed and performance tradeoffs are analyzed for spiral inductors.

In "A 1.8 GHz Low-Phase-Noise Spiral-LC CMOS VCO" by J. Craninckx and M. Steyaert, IEEE Cat. No. 0-7803-3339-X 96 (1996), pp. 30–31, silicon and GaAs technologies are discussed. Monolithic spiral inductors that are formed on conductive substrates tend to have reduced Qs due to losses that are caused by ground currents being induced in the substrate beneath the spiral inductors.

Unfortunately, while GaAs substrates may be made to be semi-insulating, thereby reducing or substantially eliminating parasitic substrate currents, GaAs substrates are expensive. Additionally, many GaAs devices have higher standby power requirements than do silicon devices.

Silicon substrates are typically provided with a lightly doped epitaxial layer for formation of active components (e.g., transistors and the like). A more heavily doped substrate is usually employed to support the epitaxial layer and to provide a low resistance ground return path for components formed in the epitaxial layer. Additionally, a highly doped substrate aids in prevention of latch-up phenomena.

While the heavily doped substrate provides a ground return path for the active circuits, it also results in reduced coil Q and losses when coils are formed on insulating layers above the substrate. As a result, silicon substrates that have been prepared for formation of active components are poorly suited to formation of high Q inductors.

One approach to providing monolithic inductors having increased Qs is to form a thick dielectric layer on the substrate. The inductors require a relatively thick dielectric layer in order to be adequately isolated from the conductive substrate. However, this results in a nonplanar surface, which interferes with photolithographic processes employed for definition of other circuit elements. Additionally, these dielectric layers tend to result in substantial stresses in the substrate, which can lead to bowing of the substrate and other problems.

It would be highly advantageous, therefore, to remedy the foregoing and other deficiencies inherent in the prior art.

Accordingly, it is an object of the present invention to provide improvements in masking for formation of high quality, thick dielectric layers in silicon substrates.

Another object of the present invention is the provision of an improved platform for formation of high speed digital busses on silicon substrates.

An additional object of the instant invention is the provision of an improved method and apparatus for providing thick dielectric layers on silicon substrates while preserving planarity of the substrate surface.

Moreover, an object of the instant invention is the provision of an improved method and apparatus for providing reduction in coil losses while preserving capability for formation of active components on a silicon substrate.

Still a further additional object of the present invention is to provide an improved process for forming passive components on silicon.

Still another object of the present invention is the provision of a method, system and apparatus for suppressing losses in coils that are monolithically co-integrated with other microelectronic components.

Yet still another object of the instant invention is the provision of a method for forming thick, planar, low dielectric constant, low loss dielectric layers in silicon substrates.

And a further object of the invention is to provide a method, system and apparatus for suppressing losses in monolithic inductors.

And still a further object of the invention is the provision of method and apparatus, according to the foregoing, which is intended to improve operation of inductors in monolithic silicon circuits.

SUMMARY OF THE INVENTION

Briefly stated, to achieve the desired objects of the instant invention in accordance with an aspect thereof, provided is a semiconductor device including a die attach surface having a first pedestal and a first semiconductor die having a first surface formed with a first cavity for mounting the first semiconductor die on the first pedestal.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which.

DETAILED DESCRIPTION OF THE PREFERRED EMBODIMENT

Figure 1:
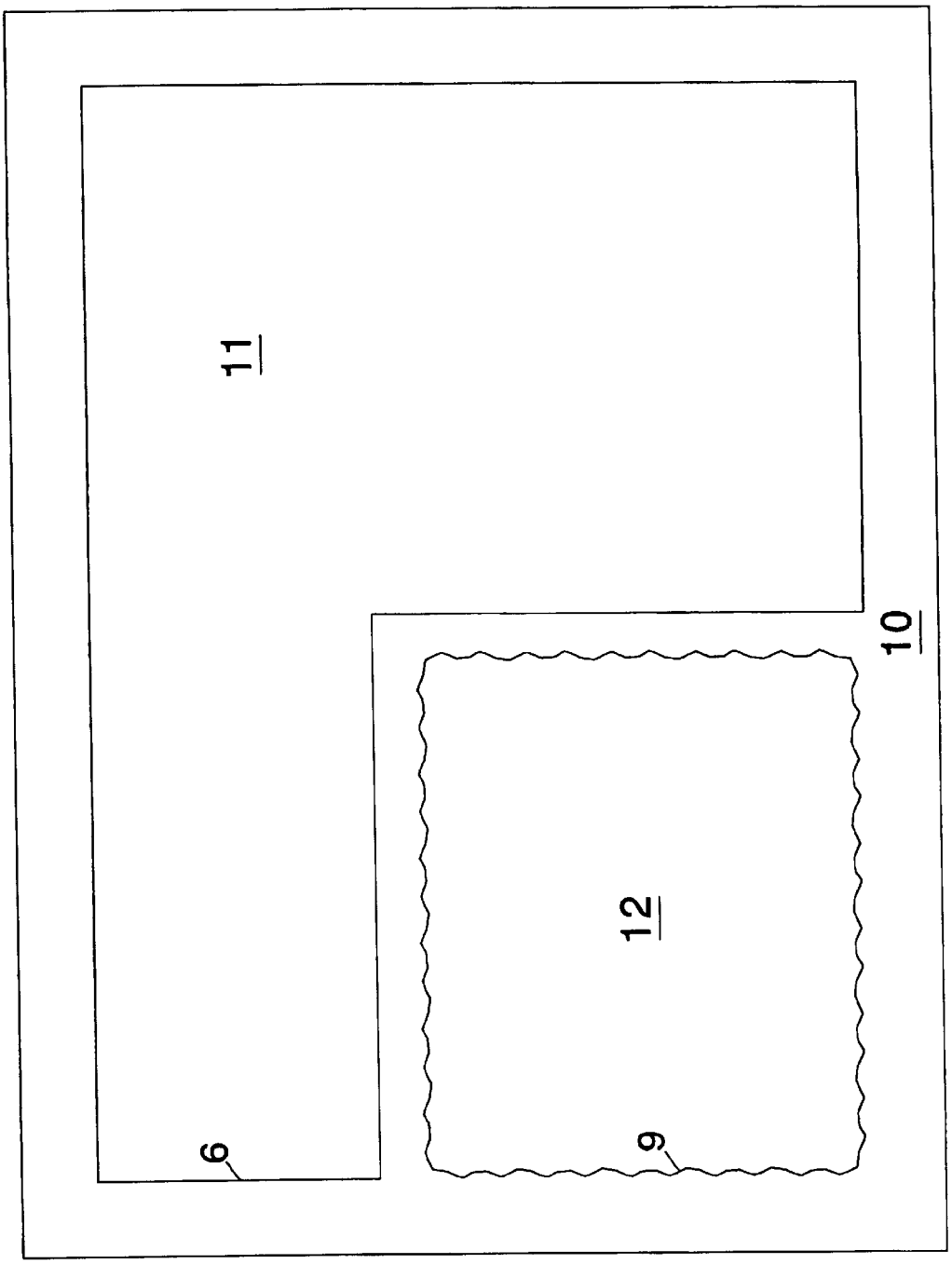
FIG. 1 is a simplified plan view of a portion of an integrated circuit including an etch mask formed on a silicon substrate, in accordance with an embodiment of the instant invention.

Turning now to the drawings, in which like reference characters indicate corresponding elements throughout the several views, attention is first directed to FIG. 1, which illustrates a simplified plan view of an embodiment of a dielectric platform, generally designated by the reference character 12, in accordance with an embodiment of the instant invention.

FIG. 1 is a simplified plan view of a portion of an integrated circuit showing a dielectric platform 12 formed in a silicon substrate 10, in accordance with an embodiment of the instant invention. The substrate 10 includes one or more areas 11 that may be used to support active electrical components such as MOS and bipolar transistors, diodes, and the like. Active electronic components may be formed in the areas 11 using conventional CMOS, bipolar or BiCMOS processes. The dielectric platform 12 is outlined by a boundary 9 and the area 11 is outlined by a boundary 6. The dielectric platform 12 may be used to support passive electrical components such as interconnections, which may be formed from metals or doped polycrystalline silicon, for example.

The dielectric platform 12 may also be used to support inductors, such as spiral inductors, or thin film resistors, such as doped polycrystalline silicon or metal resistors. The platform 12 may also be used to support capacitors having two conductive plates separate by an insulating dielectric. The conductive plates may each be formed from metal, polycrystalline silicon or metal suicides. Examples include metal-insulator-metal, poly-insulator-metal, metal silicide-insulator-metal, poly-insulator-metal silicide or poly-insulator-poly capacitors.

An advantage provided by the dielectric platform 12 is that passive components formed on the dielectric platform 12 have greatly reduced capacitance to the conductive silicon substrate 10. As a result, reduced amounts of electrical power are required in order to switch electrical signals in conductors and other components formed on the dielectric platform 12, such as high speed digital busses and interconnects.

Increased electrical Qs and increased operating frequencies are possible for passive components formed on the dielectric platform 12, as is discussed in the Annual Report 1998 of the Instut Fur Halbleiter Physik (Prof. Abbas Ourmazed, IHP 15230, pp. 50–51). The approach described in this report provides improvements in coil Qs but also relies on long trenches that are subsequently oxidized to provide a thick dielectric having voids comprising only about 20% of the total volume of the dielectric. Further, these structures can result in substantial stresses being produced in the directions of the trenches.

It will be appreciated that while only one of the dielectric platforms 12 and areas 11 are shown in FIG. 1 for simplicity of illustration and ease of understanding, multiple examples of either may be formed on the substrate 10.

Figure 2:
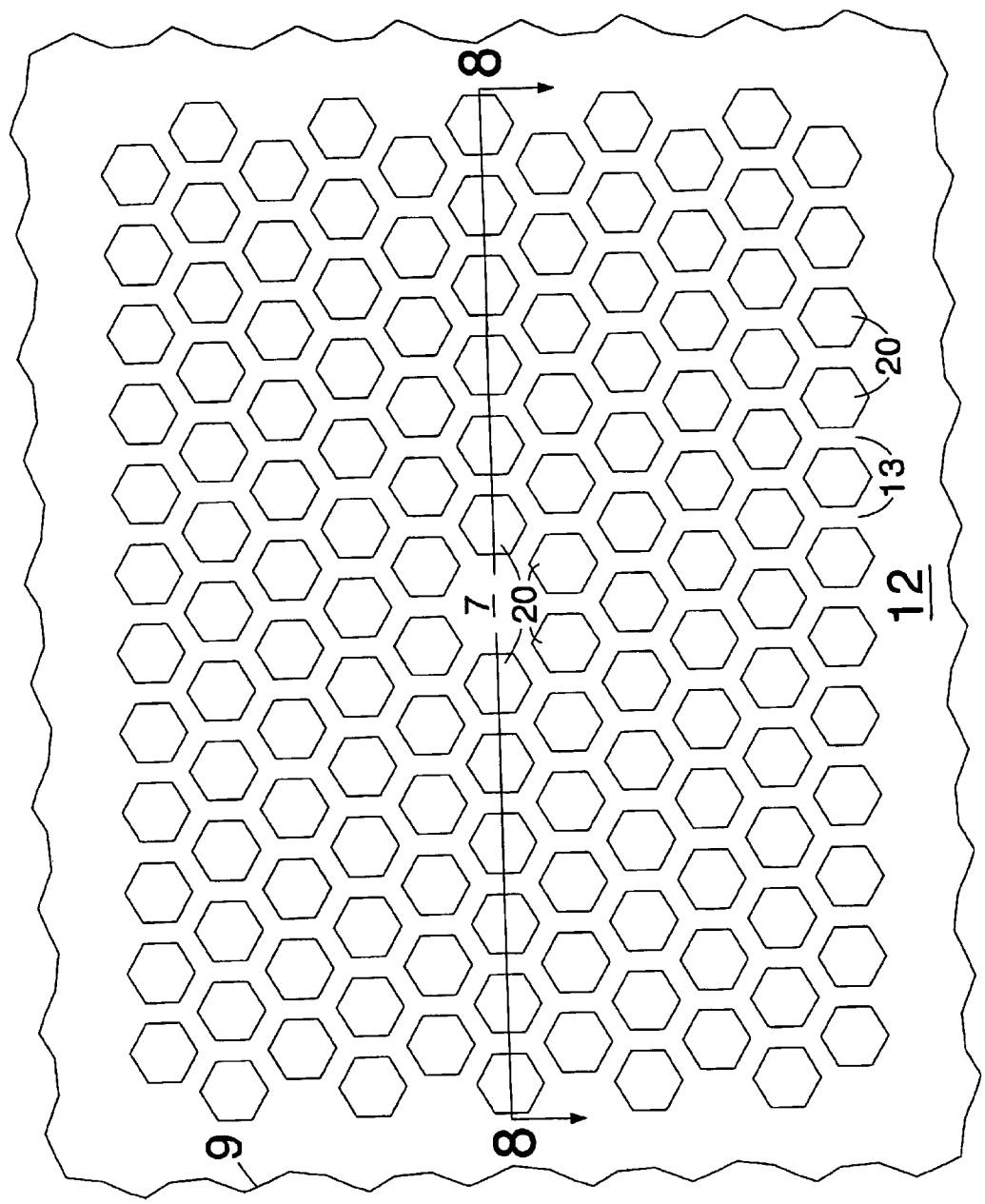
FIG. 2 is a simplified and enlarged plan view of a portion of the dielectric platform shown in FIG. 1, in accordance with an embodiment of the instant invention.

FIG. 2 is a simplified and enlarged plan view of a portion of the dielectric platform 12 shown in FIG. 1, in accordance with an embodiment of the instant invention. Within the boundary 9 of region 12, a mask 13 is formed that includes multiple openings 20. The openings 20 may have any shape, however, hexagonal openings 20 are shown in FIG. 2. In one embodiment, the mask 13 is formed by oxidizing a portion or all of the silicon substrate 10 followed by conventional photolithography and etching. One or more regions 7 may also be formed in portions of the mask 13.

In one embodiment, the openings 20 are formed to have a width, measured along section line 8—8, of between 0.5 and 2 microns. In one embodiment, the openings 20 are formed to have a width of about 1.2 microns and are separated by about 0.4 microns.

Figure 3:
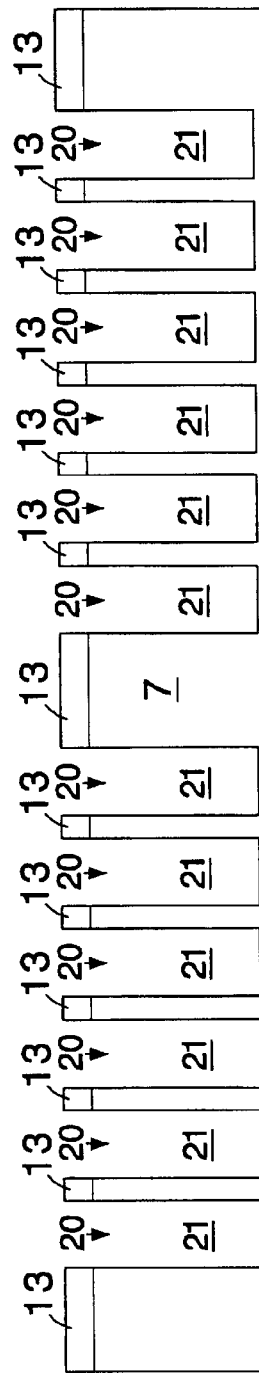
FIG. 3 is a simplified side view, in section, taken along section lines 8—8 of FIG. 2, of a silicon substrate at another step in processing, in accordance with an embodiment of the present invention.

FIG. 3 is a simplified side view, in section, taken along section lines 8—8 of FIG. 2, of a silicon substrate 10 at another step in processing, in accordance with an embodiment of the present invention. FIG. 3 illustrates a mask layer 13 having openings 20 and cavities 21 formed by etching the silicon substrate 10 through the mask 13. In one embodiment, the cavities 21 are formed by conventional anisotropic plasma etching of the silicon substrate 10 to have a depth of between 1 and ten microns. In one embodiment, the cavities are etched to have a depth of about three microns. In one embodiment, the etching is carried out using high speed anisotropic etching in a HBr/NF$_3$/He—O$_2$ plasma.

In one embodiment, the mask 13 is formed by conventional oxidation of portions of the substrate 10, followed by conventional photolithography and etching, such as anisotropic plasma etching. In one embodiment, the mask 13 is formed to have a thickness of between 0.3 and 1.0 microns. In one embodiment, the mask 13 is formed to have a thickness of about 0.6 microns.

Figure 4:
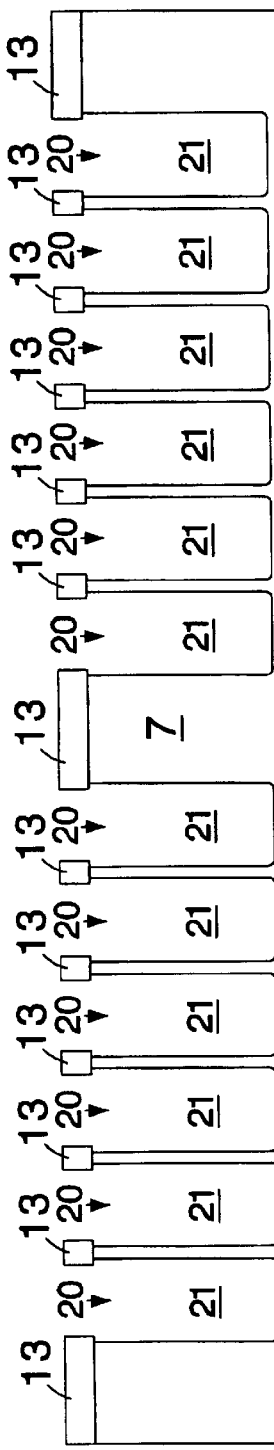
FIG. 4 is a simplified side view, in section, taken along section lines 8—8 of FIG. 2, of a silicon substrate at another step in processing, in accordance with an embodiment of the present invention.

FIG. 4 is a simplified side view, in section, taken along section lines 8—8 of FIG. 2, of a silicon substrate 10 at another step in processing, in accordance with an embodiment of the present invention. A conventional isotropic etch of the silicon substrate 10 has been employed to enlarge the cavities 21 and to reduce the thickness of the sidewalls separating the cavities 21. In one embodiment, the sidewalls are etched to have a thickness of about 0.2 microns. In one embodiment, the sidewalls are etched to have a thickness of between 0.1 and 0.4 microns.

Figure 5:
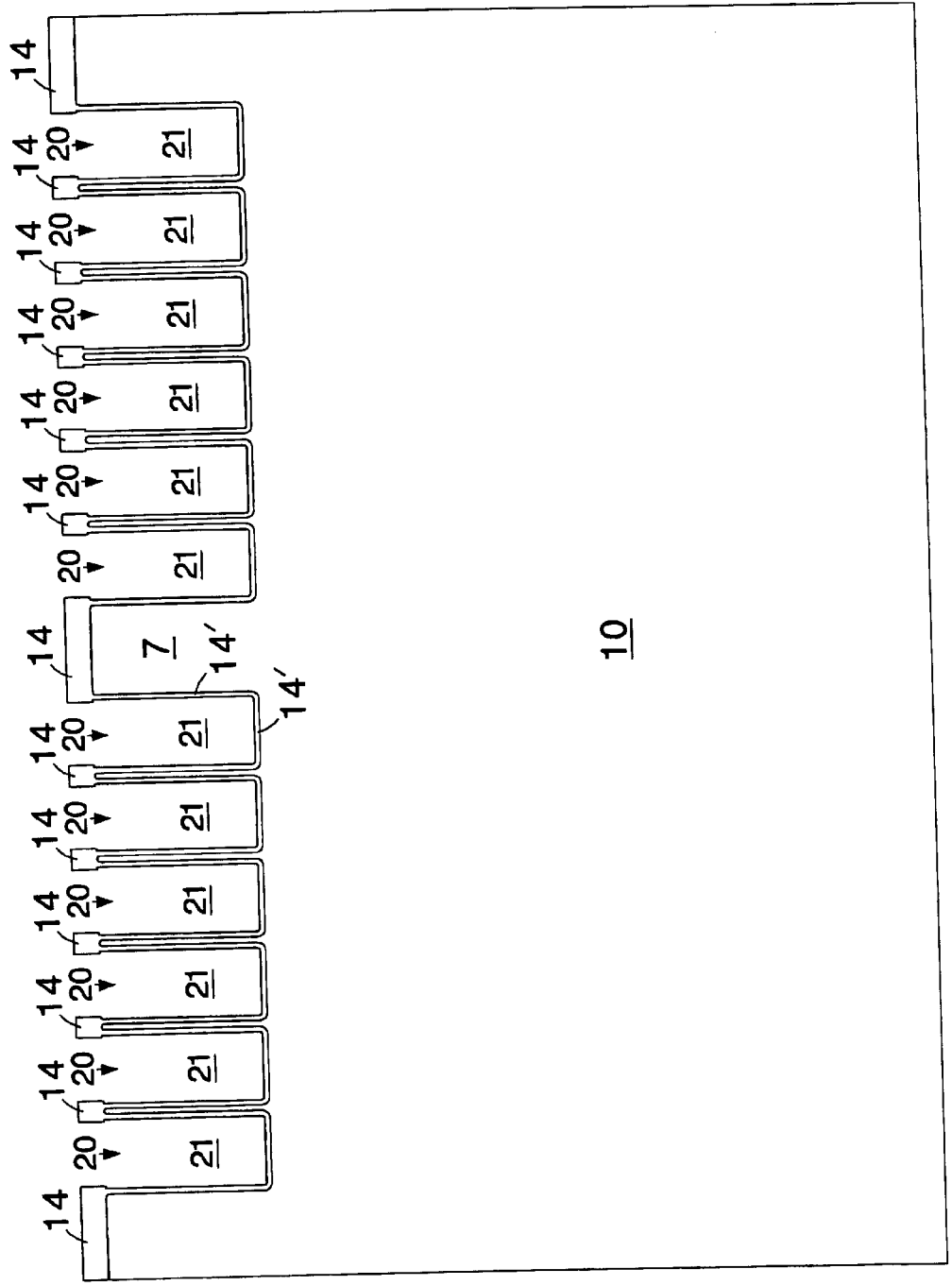
FIG. 5 is a simplified side view, in section, taken along section lines 8—8 of FIG. 2, of a silicon substrate at another step in processing, in accordance with an embodiment of the present invention.

FIG. 5 is a simplified side view, in section, taken along section lines 8—8 of FIG. 2, of a silicon substrate 10 at another step in processing, in accordance with an embodiment of the present invention. A conventional oxidation has been employed to oxidize all exposed silicon surfaces in the cavities 21, and the mask 13 has increased in thickness to form a mask 14. In one embodiment, the oxidation has been carried out to form an oxide layer 14. In one embodiment, the sidewalls have been oxidized to provide an oxide 14' having a thickness of between 0.01 and 0.2 microns. In one embodiment, the sidewalls have been oxidized to provide an oxide 14' having a thickness of about 0.1 micron.

Figure 6:
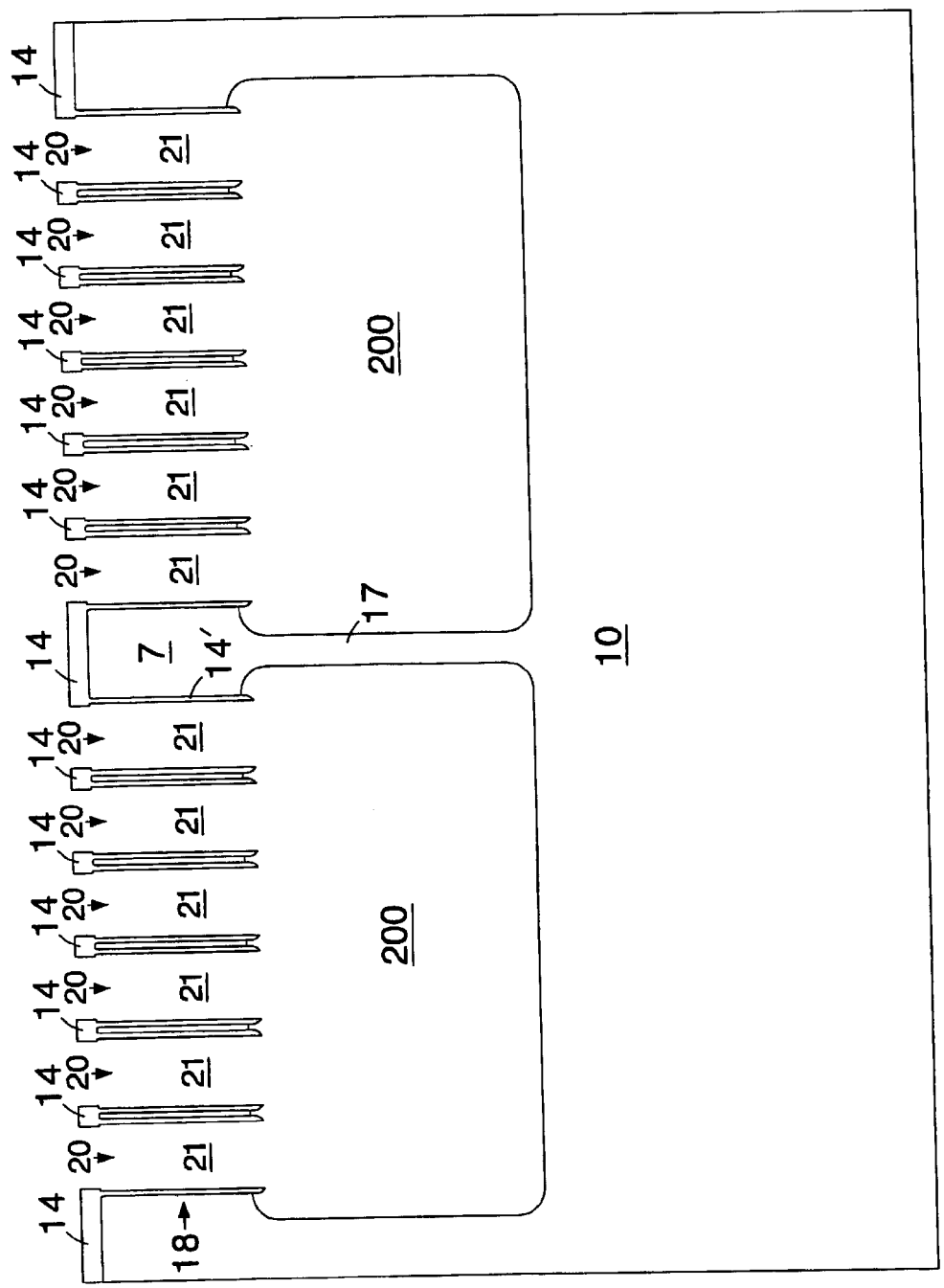
FIG. 6 is a simplified side view, in section, taken along section lines 8—8 of FIG. 2, of a silicon substrate at another step in processing, in accordance with an embodiment of the present invention.

FIG. 6 is a simplified side view, in section, taken along section lines 8—8 of FIG. 2, of a silicon substrate 10 at another step in processing, in accordance with an embodiment of the present invention. A conventional anisotropic plasma etch is used to remove the oxide layer 14' from bottoms of the cavities 21 but not from sidewalls of the cavities 21.

A conventional silicon etch is used to remove silicon from beneath the cavities 21 to provide one or more cavities 200. In one embodiment, the silicon etch is a high speed plasma etch having predominantly anisotropic characteristics. In one embodiment, alternating between isotropic etching and anisotropic etching completes the cavity 200. In one embodiment, one or more pillars 17 are formed within the cavity 200 beneath the region 7. In one embodiment, the cavity 200 is formed to have a depth of between 2 and 15 microns, and the increase in width is between 0.2 and 0.7 microns. In one embodiment, the cavity 200 is formed to have a depth of about 5 microns, and the increase in width is about 0.5 microns. As a result of these etches, a suspended lattice 18 comprised of silicon and a silicon-based dielectric is formed above the cavity 200.

Figure 7:
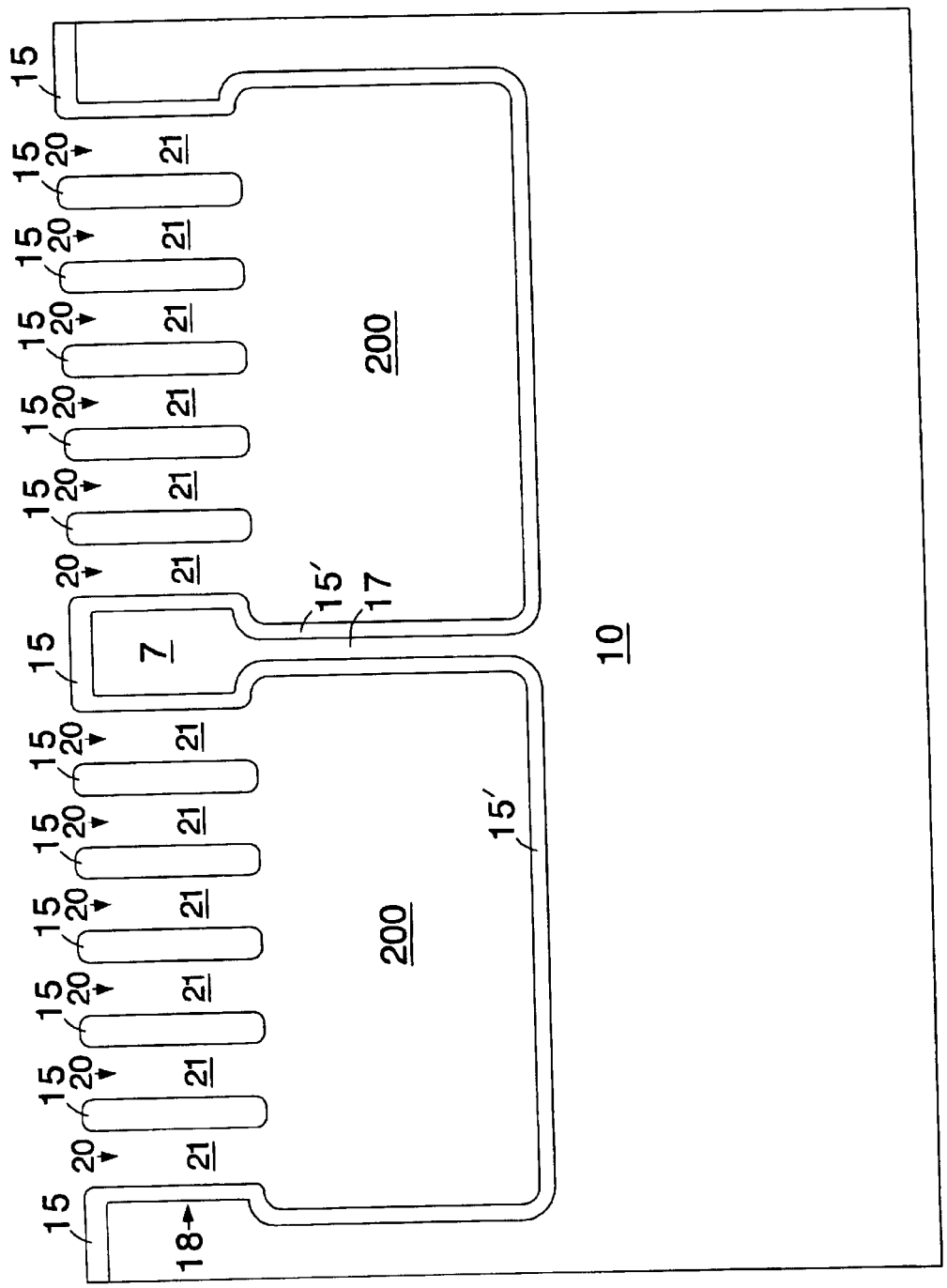
FIG. 7 is a simplified and enlarged side view, in section, taken along section lines 8—8 of FIG. 2, of a silicon substrate at another step in processing, in accordance with an embodiment of the instant invention.

FIG. 7 is a simplified and enlarged side view, in section, taken along section lines 8—8 of FIG. 2, of a silicon substrate 10 at another step in processing, in accordance with an embodiment of the instant invention. A conventional thermal oxidation has been used to provide a silicon dioxide layer 15' on all exposed silicon surfaces and to convert the suspended lattice 18 to silicon dioxide 15. As a result of the oxidation, the openings 20 have a reduced width. In one embodiment, the openings 20 have a width of about 1.16 microns and the silicon dioxide separating the openings 20 has a width of about 0.44 microns. In one embodiment, the oxide 15' has a thickness of about 0.22 microns. In one embodiment, the oxides 15 and 15' are conventional silicon oxynitride layers.

Figure 8:
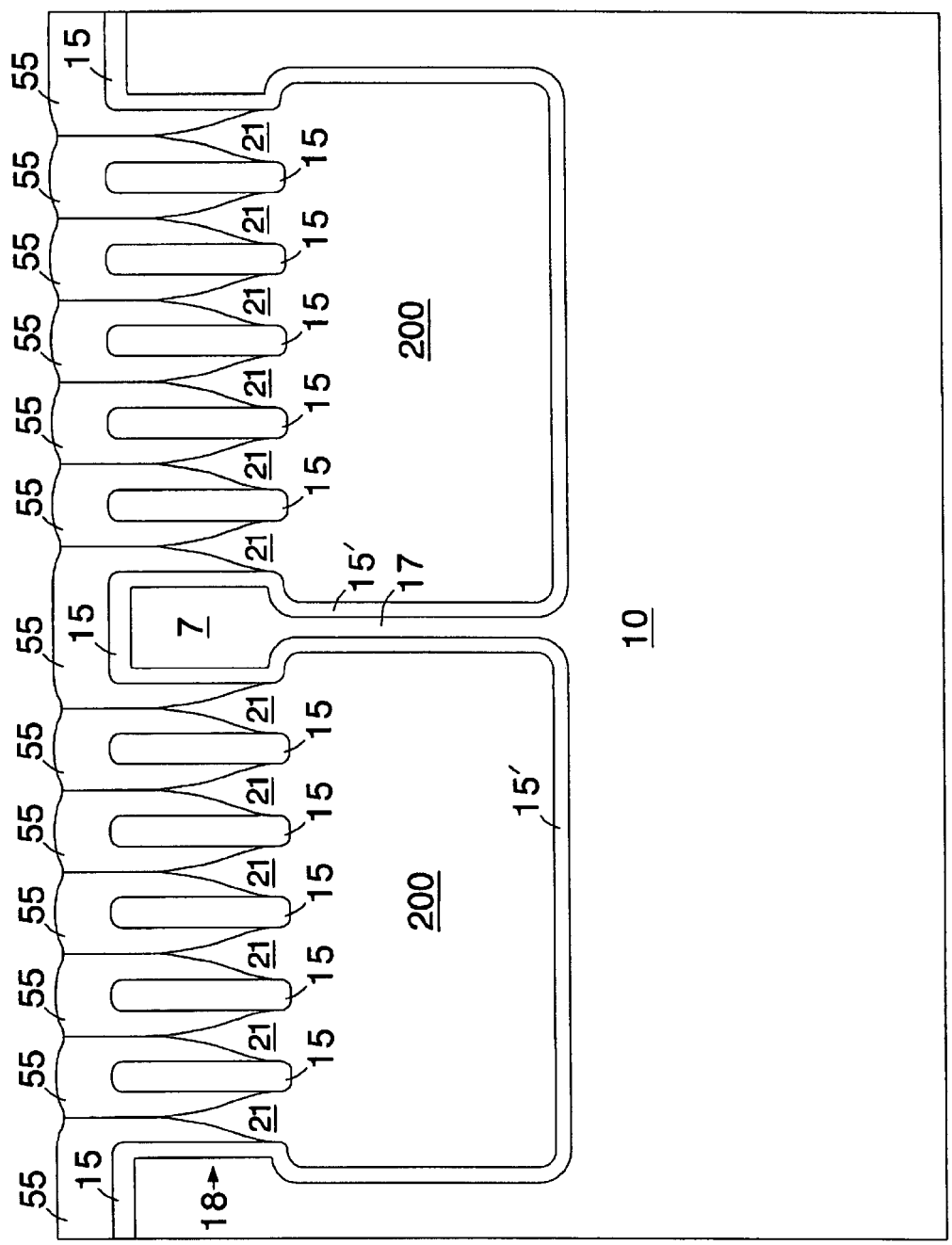
FIG. 8 is a simplified side view, in section, taken along section lines 8—8 of FIG. 2, of a silicon substrate at another step in processing, in accordance with an embodiment of the instant invention.

FIG. 8 is a simplified side view, in section, taken along section lines 8—8 of FIG. 2, of a silicon substrate 10 at another step in processing, in accordance with an embodiment of the instant invention. A layer 55 has been formed to fill all or most of the openings 20. The layer 55 may seal the openings 20 and isolate the cavity 200 from potential contamination. The layer 55 may be formed using CVD or gas deposition techniques.

In one embodiment, a conventional TEOS process may be used to deposit an oxide layer 55. It will be appreciated that formation of the layer 55 may result in some deposition of silicon dioxide within the cavity 200, however, significant improvements in relative dielectric constant and in parasitic capacitance to the substrate may still be provided. Conventional TEOS processes include heating of the substrate 10 in a partial vacuum, resulting in a partial vacuum or gaseous dielectric in the cavity 200 after the TEOS layer 55 seals the openings 20.

In one embodiment, the oxide layer 55 has been formed to a thickness of about 1.1 microns. The TEOS oxide layer 55 is formed and seals the cavity 200, resulting in a continuous oxide layer 55 at and slightly beneath the surface of the silicon substrate 10, filling tops of the cavities 21 and sealing them. In one embodiment, the cavity 200 includes a gaseous dielectric.

Figure 9:
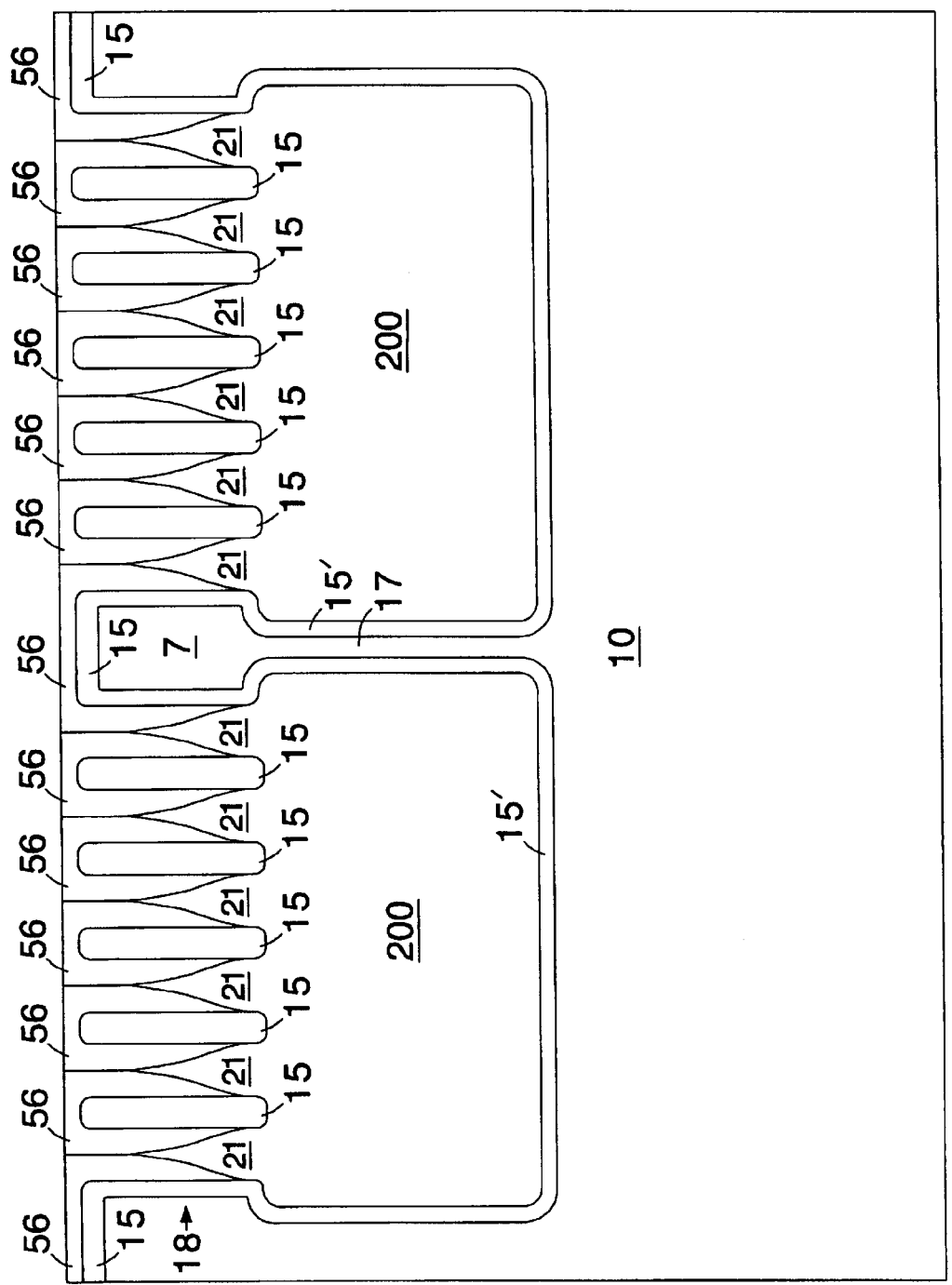
FIG. 9 is a simplified side view, in section, taken along section lines 8—8 of FIG. 2, of a silicon substrate at another step in processing, in accordance with an embodiment of the instant invention.

FIG. 9 is a simplified side view, in section, taken along section lines 8—8 of FIG. 2, of a silicon substrate 10 at another step in processing, in accordance with an embodiment of the instant invention. A conventional chemical-mechanical polish has been used to provide planarized regions 56 on the top surface of the silicon substrate 10 and to remove some or most of the TEOS oxide layer 55 from the regions 11 that will be employed in subsequent processing to provide active electronic components, as discussed above.

As a result, the planarized region 56 completes a dielectric platform that includes a cavity 200 in the conductive silicon substrate 10. The dielectric constant of the composite structure is greatly reduced compared to, e.g., what would be provided by a thick, predominantly solid dielectric layer. Additionally, reduced stress is induced in the silicon substrate 10 compared to thick dielectric layers or to dielectric layers prepared using etched trenches followed by oxidation, because the dielectric platform does not include long portions formed from oxide and does include substantial volumes that are not occupied by solids having thermal coefficients of expansion differing from that of the silicon substrate 10.

In one embodiment, the dielectric platform includes voids occupying in excess of 40% of the total volume prior to TEOS deposition. This results in an effective dielectric constant reduction of about 30%, from an $\in_R$ of about 3.9 to an effective $\in_R$ of about 2.74. In one embodiment, the dielectric platform includes voids occupying in excess of 50% of the total volume prior to TEOS deposition. This results in an effective dielectric constant reduction of about 39%, from an $\in_R$ of about 3.9 to an effective $\in_R$ of about 2.39. Formation of cavity 200 results in further reductions of the effective dielectric constant. In one embodiment, assuming a depth of about three microns for the silicon dioxide lattice 18 and a depth of about five microns for the cavity 200, an effective dielectric constant $\in_R$ of about 1.81 is provided over a depth of about 8 microns. As a result, passive elements formed on top of the layer 56 of the dielectric platform 12 have sharply reduced parasitic capacitances to the substrate 10.

Traditional integrated circuits employ relative thin (e.g., less than one micron) dielectric layers for isolation of passive components and busses from the substrate. In comparison, the dielectric platform 12 of the present invention is capable of providing a substantially thicker dielectric. Additionally, the dielectric platform 12 may be formed to have a reduced dielectric constant relative to conventional dielectric layers. As a result, the effective dielectric constant of the dielectric platform 12 is reduced by both the reduced effective dielectric constant and the increased thickness. In one embodiment, the effective dielectric constant for capacitance between passive components formed on the surface 56 of the dielectric platform 12 and the substrate 10 is reduced by a factor of between one and two orders of magnitude over that of conventional dielectric layers. As a result, parasitic capacitance to the substrate is greatly reduced and losses due to substrate resistance are also dramatically reduced. The amount of current needed to switch the electrical state of conductors formed on the dielectric platform 12 is also dramatically reduced, reducing power requirements for integrated circuits formed using the dielectric platform 12.

For example, conventional CMOS and bipolar integrated circuits may be formed in areas adjacent to the dielectric platform 12, and these circuits may be coupled to and employ passive components such as spiral inductors, microstrip transmission lines and the like that are formed on the planar surface of the dielectric platform 12. Separating the planar surface from the silicon substrate 10 allows higher Qs to be realized for these passive components.

Figure 10:
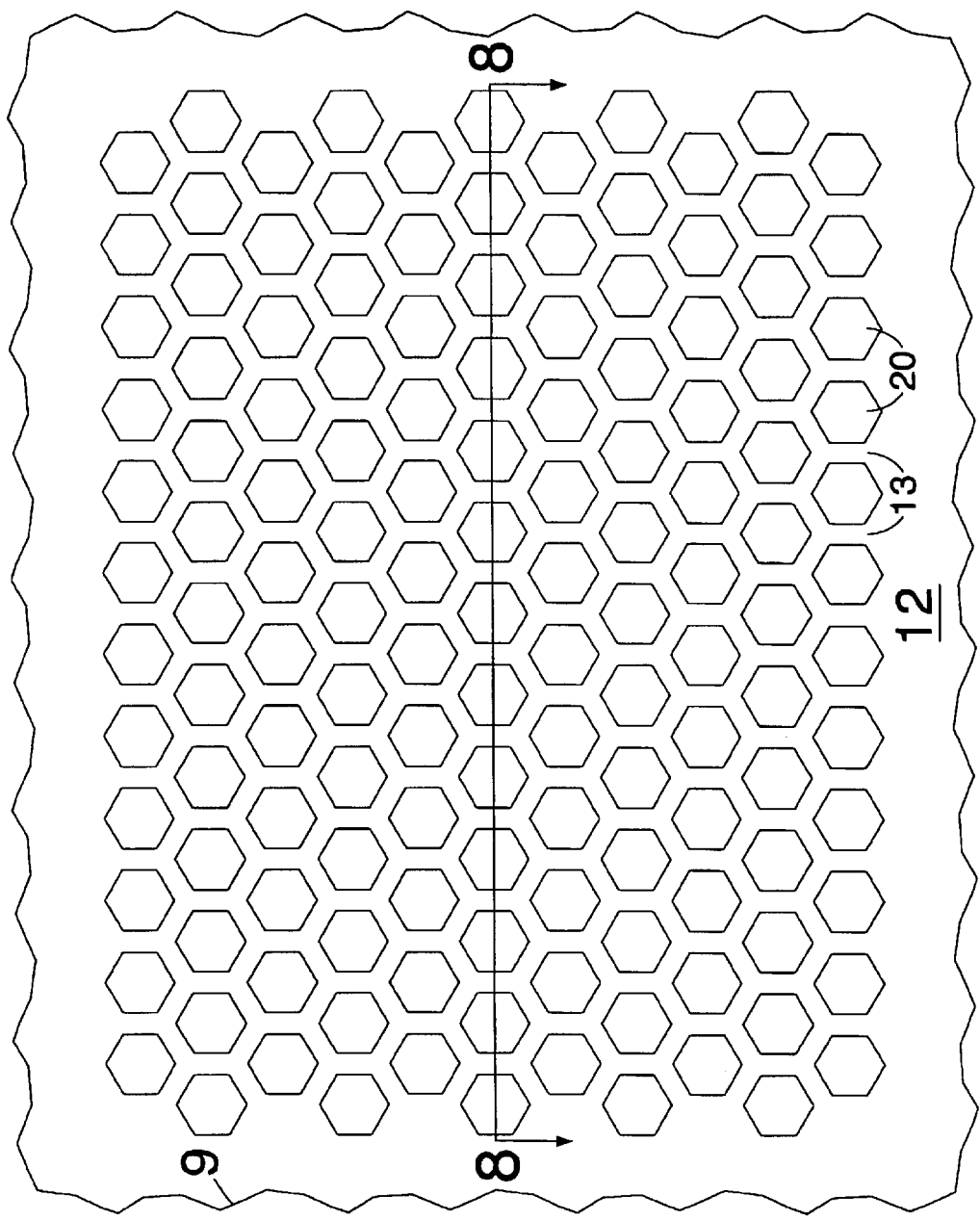
FIG. 10 is a simplified and enlarged plan view of a portion the dielectric platform shown in FIG. 1, in accordance with an embodiment of the instant invention.

FIG. 10 is a simplified and enlarged plan view of a portion the dielectric platform 12 shown in FIG. 1, in accordance with an embodiment of the instant invention. The dielectric platform 12 of FIG. 10 differs from that of FIG. 2 et seq. in that the initial masking layer does not include provision for formation of the one or more pillars 17 that were formed within the cavity 200 beneath the region 7. In other words, within the boundary 9 of region 12, the mask 13 is formed as described above, but the mask 13 comprises contiguous openings 20 spanning an interior of the mask 13.

Figure 11:
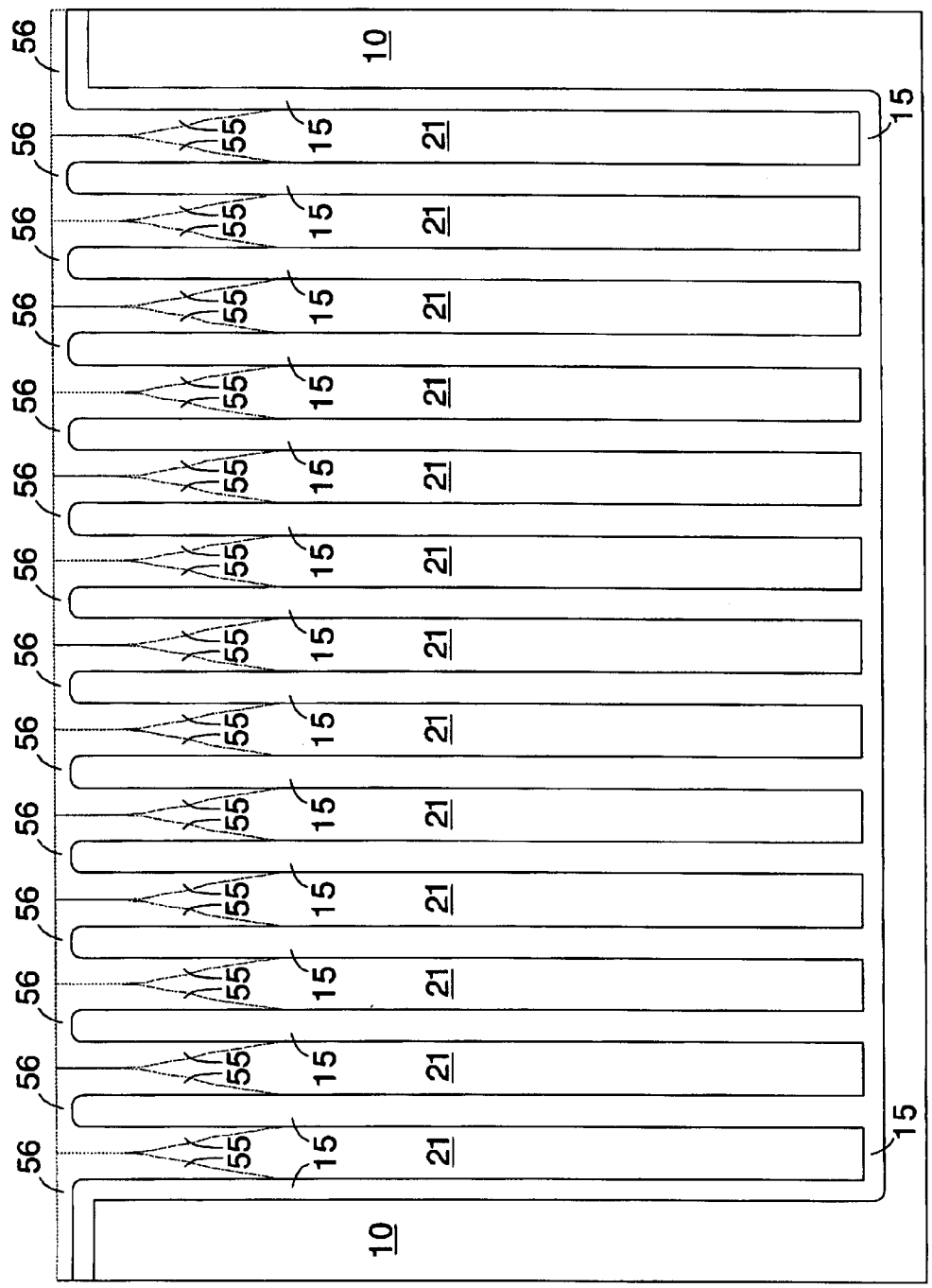
FIG. 11 is a simplified side view, in section, taken along section lines 11—11 of FIG. 10, in accordance with an embodiment of the instant invention.

FIG. 11 is a simplified side view, in section, taken along section lines 11—11 of FIG. 10, in accordance with an embodiment of the instant invention. FIG. 11 shows a series of cavities 21 formed by etching the silicon substrate 10 through the mask 13 of FIG. 10. In one embodiment, the cavities 21 are etched to a depth of fifteen microns. In one embodiment, the cavities 21 are formed to have a depth of between ten and thirty microns. Sidewalls and bottoms of the cavities have been oxidized to form an oxide layer 15. In one embodiment, the sidewalls have been completely oxidized and a bottom oxide having a thickness of about 0.3 microns has been formed. In one embodiment, the sidewalls have been completely oxidized and a bottom oxide having a thickness of about one micron has been formed.

A layer analogous to the layer 55 of FIG. 8 has been formed to seal the openings 20 and to isolate the cavities 21 from potential contamination. This layer has been planarized as described with reference to FIG. 9 to form a planarized region 56 sealing the cavities 21.

Figure 12:
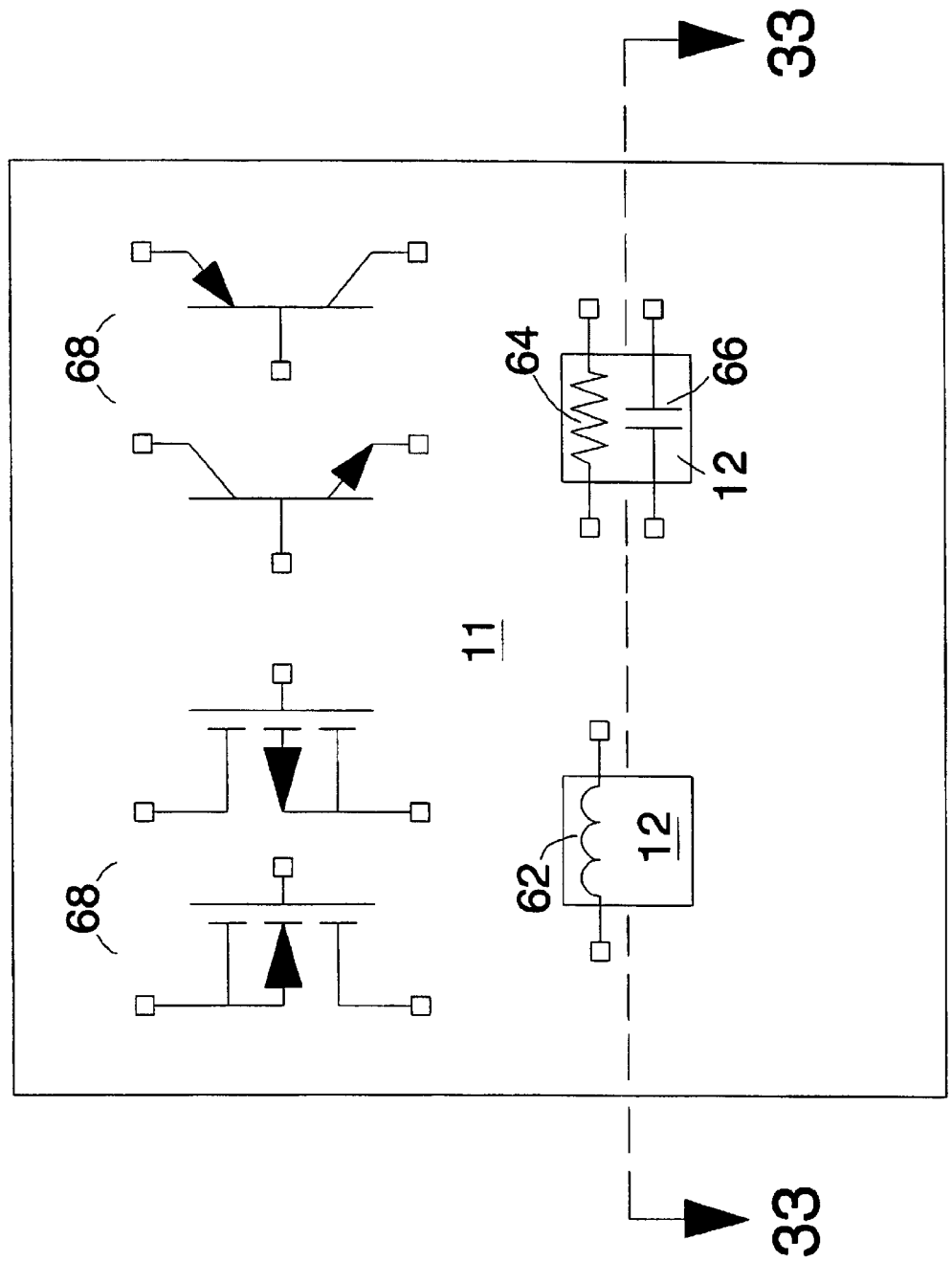
FIG. 12 is a simplified plan view of a semiconductor die including passive components, in accordance with an embodiment of the instant invention.

FIG. 12 is a simplified plan view of a semiconductor die 60 including passive components 62, 64 and 66 formed on dielectric platforms 12 and transistors 68 formed in the region 11, in accordance with an embodiment of the instant invention. As shown in FIG. 12, the transistors 68 may be MOS devices or bipolar devices. It will be appreciated that other kinds of transistors, diodes and components may also be formed on the semiconductor die 60 using conventional techniques.

Figure 13:
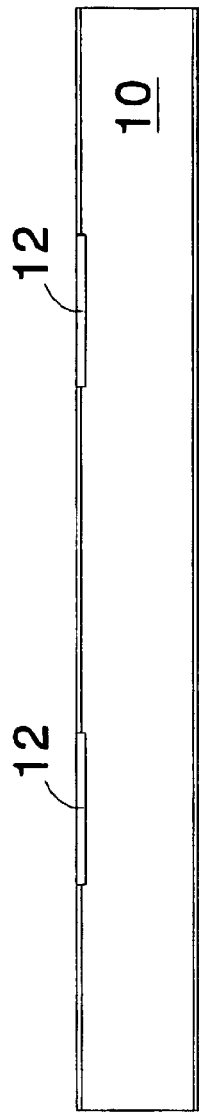
FIGS. 13A–13E are simplified side views, in section, taken along second lines 33—33 of FIG. 12, in accordance with embodiments of the instant invention.
Figure 13:
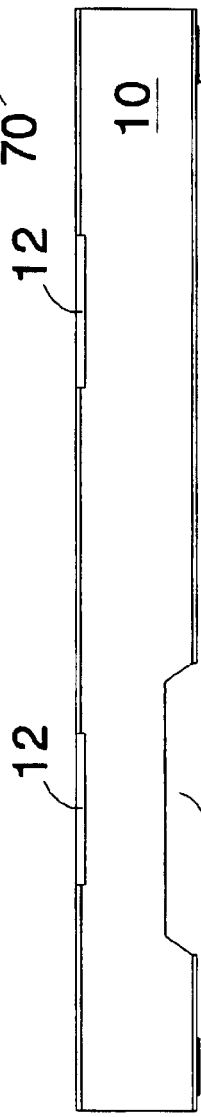
Figure 13:
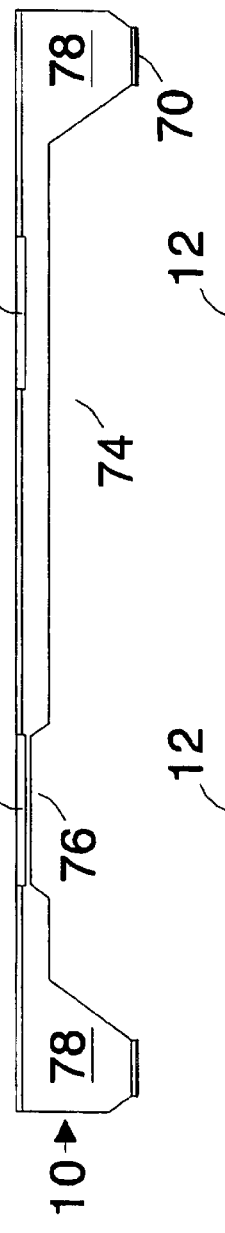
Figure 13:
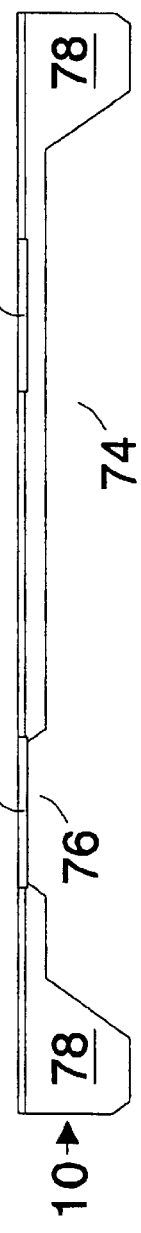
Figure 13:
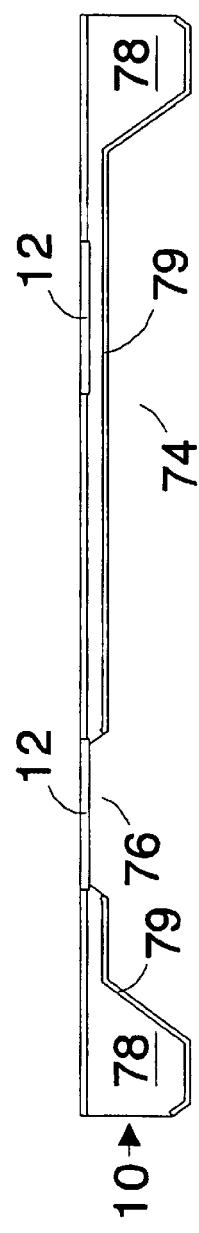

FIGS. 13A–13D are simplified side views, in section, taken along second lines 33—33 of FIG. 12, in accordance with embodiments of the instant invention. FIG. 13A shows a protective layer 70 formed on a back surface of the silicon substrate 10. The protective layer 70 typically comprises silicon dioxide and silicon nitride. An opening may be formed in the protective layer 70 beneath one or more of the dielectric platforms 11.

FIG. 13B shows a cavity 76 etched into the substrate 10 using the protective layer 70 as an etch mask to define the cavity 76. Etching of the cavity 76 in the silicon substrate 10 may be done using etchants as described in U.S. Pat. No. 5,207,866, entitled "Anisotropic Single Crystal Silicon Etching Solution And Method", issued to Ping-Chang Lue and Henry G. Hughes, which is incorporated herein by reference for teachings relating to etching of silicon. Etches prepared in accordance with such techniques may be used to form cavities that are substantially trapezoidal in cross-section and are bilaterally symmetrical about a vertical axis as shown in FIGS. 13B–D. In one embodiment, the larger interior angles of the trapezoidal cross-section are about 54.73 degrees.

FIG. 13C shows cavity 74 having a recessed region forming a cavity 76 formed by patterning and etching of a second opening in the protective layer 70. The cavity 76 results from the combination of the first and second etching steps. The cavity 76 is formed to extend nearly to the oxide layer 15 formed on bottoms of the cavities 21 of FIG. 11. In one embodiment, the cavity 76 is formed to stop on a buried epitaxial layer that was previously formed in the silicon substrate 10 using known techniques. The cavity 74 is formed to have known dimensions and to be aligned with respect to circuitry formed on the silicon substrate 10. Ridges 78 of silicon delineate edges of the cavity 74.

FIG. 13D shows the cavities 74 and 76 following stripping of the protective layer 70 and an anisotropic silicon etch that exposes bottoms of the dielectric platform 12. The anisotropic silicon etch also removes silicon material from the cavity 74 and from bottoms and sides of the ridges 78.

FIG. 13E shows the formation of bonding layer 79 on the surfaces of ridges 78 and cavity 74.

In one embodiment, a thin layer of platinum may be applied to the cavities 74 and 76 and then alloyed to form PtSi in areas where the platinum is in direct contact with silicon material. Excess platinum formed on silicon dioxide, e.g., bottoms of the dielectric platforms 12, may be then removed using conventional techniques such as aqua regia. The silicide is then plated with metals such as titaniam, tin, and gold layers or the like.

In one embodiment, photoresist is deposited in cavity 76. Following deposition of a metal layer using conventional techniques, the metal layer is removed from the region of the cavity 76 to provide a dielectric platform 12 that does not have metal plating on a lower surface of the dielectric platform.

Figure 14:
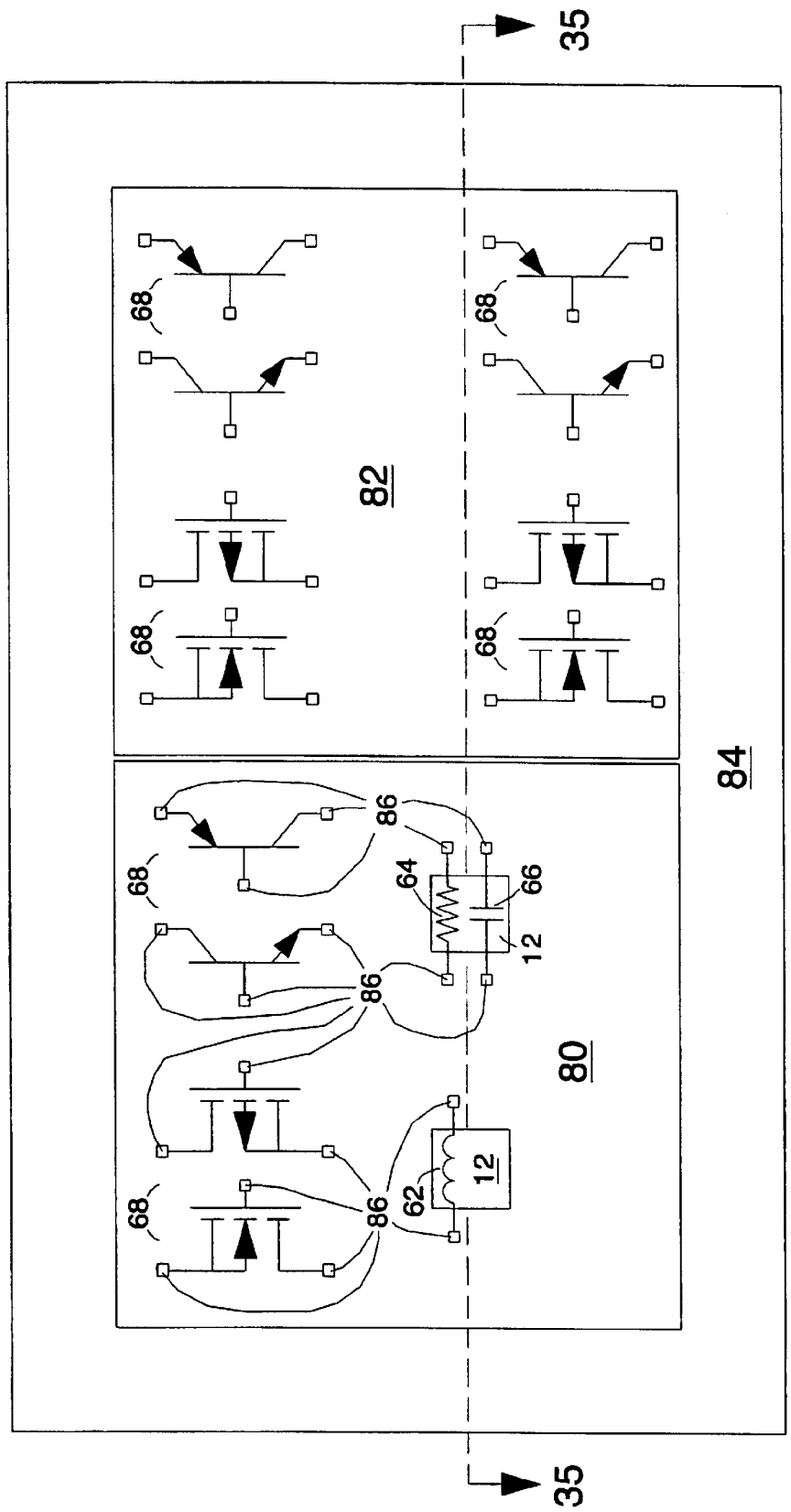
FIG. 14 is a simplified plan view of two interconnected semiconductor die co-located on a common mount, in accordance with embodiments of the instant invention.

FIG. 14 is a simplified plan view of two semiconductor die 80 and 82 co-located on a common mount 84, in accordance with embodiments of the instant invention. The die 80 is shown to include multiple dielectric platforms 12 such as those illustrated and discussed with respect to FIGS. 10 and 11 having passive components 62, 64 and 66, which may include inductors, resistors and/or capacitors formed thereon. Both die 80 and 82 are illustrated as including active components such as transistors 68. The die 80 and 82 may be of different types, e.g., an RF chip 80 and a microprocessor 82. Other types of integrated circuit die 82 known in the art may be employed as well. The die 80 and 82 also include contact pads 86.

Contact pads 86 typically are formed for a variety of reasons: to allow electrical contact to be made through one or more dielectric layers to other metallization or semiconductive regions on the die 80, 82; to facilitate electrical testing during processing using probes; and to facilitate interconnection of the die 80, 82 to other electronic components.

It will be appreciated that while only two die 80 and 82 are shown in FIG. 14 for simplicity of illustration and ease of understanding, more or fewer die may be mounted on the mount 84.

FIGS. 15A–15F are simplified side views, in section, taken along section lines 15—15 of FIG. 14, in accordance with embodiments of the instant invention.

Figure 15:
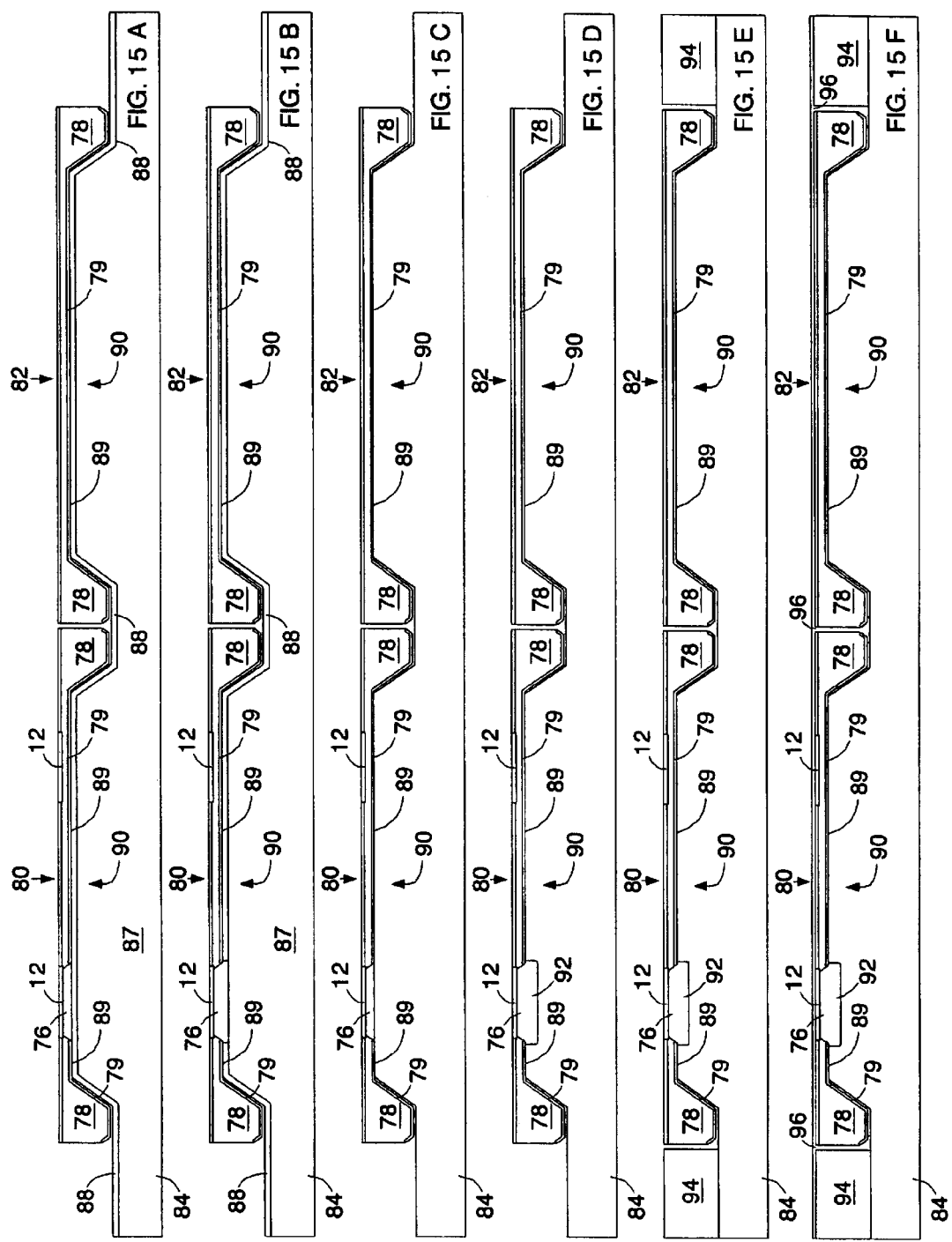
FIGS. 15A–15F are simplified side views, in section, taken along section lines 35—35 of FIG. 14, in accordance with embodiments of the instant invention.

FIG. 15A is a simplified side view of a mount 84 comprising a dielectric body 87 and a conductive surface layer 88. The mount 84 also includes elevated regions, appurtenances or pedestals 90 intended to facilitate alignment of the die 80, 82 and also for die attachment.

In one embodiment, die attachment is carried out using conventional alloy preforms and thereby forming metallurgical bonds between the silicon substrate 10 and the conductive surface layer 88. In one embodiment, the dielectric body 87 comprises ceramic. In one embodiment, the dielectric body 87 comprises beryllia. In one embodiment, the dielectric body 87 comprises a material chosen from a group consisting of alumina, alluminum nitride, and other suitable ceramic materials.

The material forming the dielectric body 87 is chosen to provide the desired bonding characteristics for the conductive layer 88, ability to withstand thermal and other subsequent treatments, ability to provide heatsinking capability for the die 80, 82 and ability to provide adequate mechanical support, including appropriate thermal coefficient of expansion matching, for the die 80, 82. In one embodiment, the conductive layer may include materials chosen of titanium nichol gold, or the like. In one embodiment, the conductive layer 88 extends beneath the dielectric platforms 12.

FIG. 15B is a simplified side view similar to that of FIG. 15A, however, the conductive layer 88 has been patterned so that it does not extend beneath the dielectric platform 12 that has had silicon removed from beneath it. This allows passive component 62 (FIG. 14) to produce fields which penetrate dialectric platform 12, cavity 76, and into dialectric material 87 of mount 84. As compared to FIG. 15A, where conductive layer 88 prevents penetration of fields into dialectric region 87 of mount 84.

The pedestals 90 are designed to fulfill several different functions. A thickness of the ridges 78 is known a priori. Additionally, spatial relationships between the ridges 78, the cavities 76 and passive 62, 64, 66 and active 68 circuitry are known a priori. Further, by ensuring mutual planarity of the pedestals 90, it is possible to mount the die 80, 82 so that top surfaces of the die 80, 82 are substantially co-planar and so that relative positions of passive 62, 64, 66 and active 68 components formed on each of the die 80, 82 are predetermined with a degree of accuracy sufficient to allow later formation of interconnections therebetween. Thicknesses of the pedestals 90 are chosen to excede the thickness of ridges 78 so that the die 80, 82 are supported and bonded by planar portions 89 of the cavities 74, rather than by the ridges 78. Areas of the pedestals 90 are chosen to be slightly smaller than areas of the cavities 74 in order that positioning the die 80, 82 oh the pedestals results in placement of the die 80, 82 relative to each other and the mount 84 to a predetermined degree of accuracy.

FIG. 15C is a simplified side view of an embodiment of the mount 84 and two die 80, 82 mounted thereon, in accordance with an embodiment of the instant invention. In one embodiment, the mount 84 is formed from a conductive material. In one embodiment, the mount 84 is formed from metal. In one embodiment, the mount 84 is formed from a material chosen from a group consisting of copper, copper tungsten alloy, kovar, molybedenum, and the like, having good thermal conductivity, and matching the thermal coefficient of expansion of silicon.

FIG. 15D is a simplified side view of an embodiment of the mount 84 and two die 80, 82 mounted thereon, in accordance with an embodiment of the instant invention. The mount 84 is formed from a conductive material but includes an opening 92 formed in a top surface of the pedestal 90 configured to provide an increased separation from passive component 62. This allows passive component 62 (FIG. 14) to produce fields which penetrate dielectric platform 12, cavity 76, and into dielectric cavity 92. As a result, parasitic capacitance to ground is reduced compared to the configurations illustrated in FIG. 15C. In one embodiment, the opening 92 is formed to have a depth of about 50 to 500 microns. In one embodiment the depth of dielectric cavity 92 is about 100 microns.

In one embodiment, the pedestal is formed to have a height that is slightly greater than a depth of the cavity 74 formed in the die 80. In one embodiment, the pedestal comprises a bilaterally symmetrical trapezoidal cross section and wherein the smallest angles in the cross section are about 54.73 degrees.

FIG. 15E is a simplified side view of the mount 84 according to any of the embodiments of the invention, having two die 80, 82 mounted thereon, and further including a ring of material 94. In one embodiment, the ring of material 94 is formed from a dielectric material. In one embodiment, the ring of material surrounds the die 80, 82 on all lateral edges. In one embodiment, the material 94 does not form a ring and abuts selected portions of the die 80, 82. In one embodiment, the material 94 is formed on the mount 84 before placement and bonding of the die 80, 82. In one embodiment, the material 94 is coupled to the mount 84 after attachment of the die 80,82 to the mount 84. The material 94 is configured to abut the die 80, 82 with a predetermined separation from the die 80,82 and to have an upper surface that is substantially coplanar with upper surfaces of the die 80, 82. Material 94 may be comprised of the same materials as listed as options for material 87 of FIG. 15A–B.

FIG. 15F is a simplified side view of the mount 84, the die 80, 82 mounted thereon and the material 94 following application and (if needed) planarization of a dielectric layer 96. The dielectric layer 96 occupies interstices between the die 80, 82, between the die 80, 82 and the material 94 and also may extend across top surfaces of the die 80, 82. The dielectric layer 96 is chosen to provide an appropriate thermal coefficient of expansion match to the mount 84 and die 80, 82, to provide planar surfaces bridging interstices between die 80,82 and between die 80 or 82 and the material 94, to insulate various elements from one another and to permit patterning of the dielectric layer 96.

Figure 16:
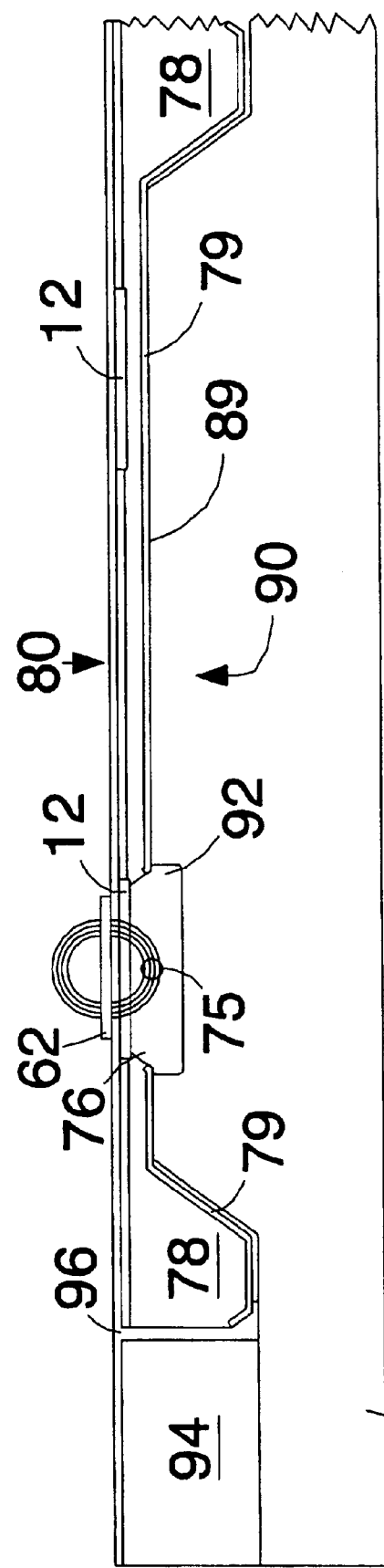
FIG. 16 is a simplified side view of the die 80 portion of FIG. 15F, in accordance with embodiments of the instant invention.

FIG. 16 shows mount 84 in further detail. A passive component 62 is disposed on an upper surface of planarization layer 96. Passive component 62 generates a field 75 which penetrates dielectric layer 96 and dielectric platform 12 to impinge on dielectric cavity 76 and dielectric cavity 92. It should be appreciated that a number of types of electrical components may be used to generate field 75. In one embodiment, passive component 62 operates as an inductor generating field 75 as a magnetic field. In one embodiment, passive component 62 produces an electric field that penetrates cavity 92.

Figure 17:
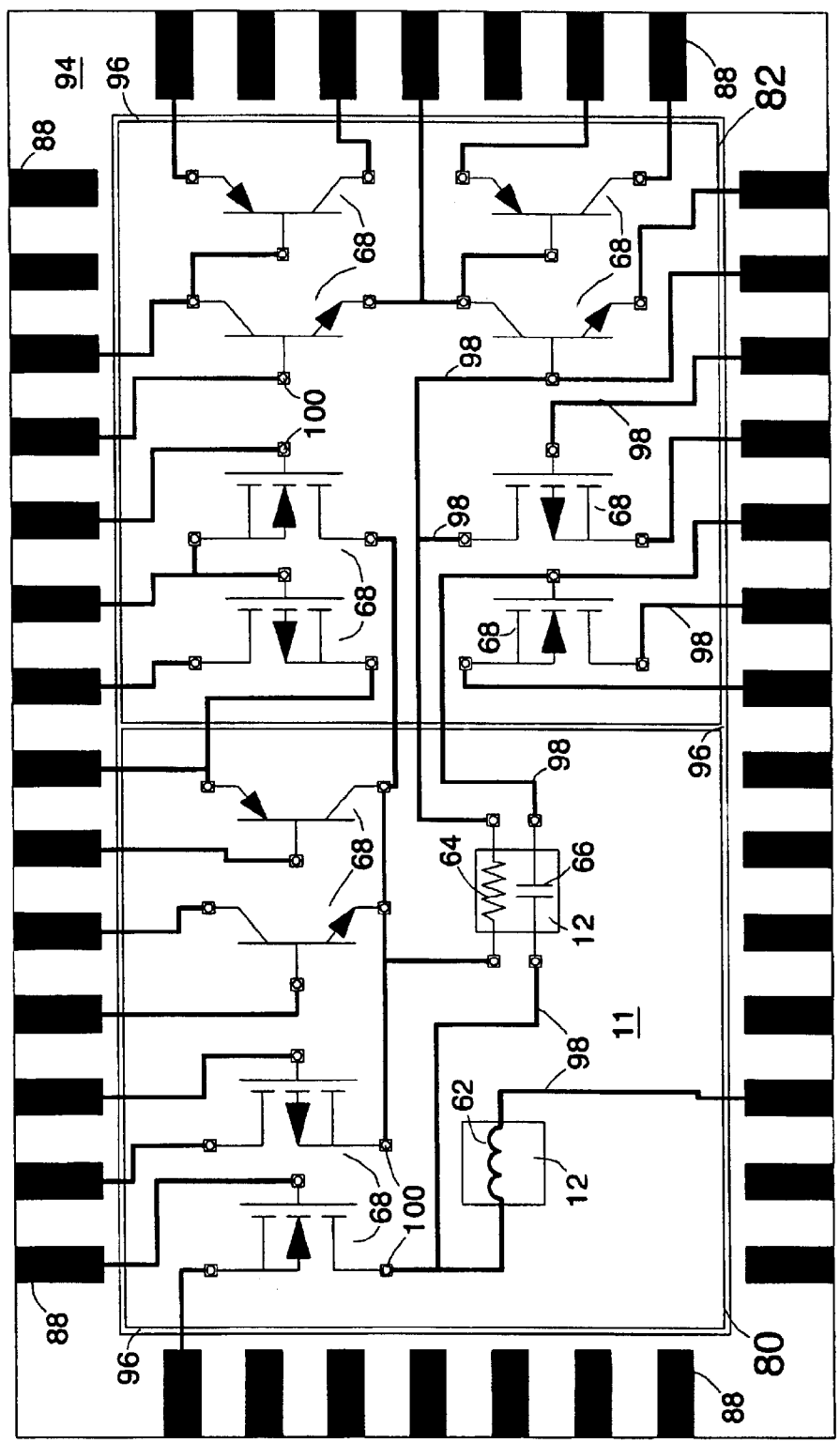
FIG. 17 is a simplified plan view of two interconnected semiconductor die co-located and a surrounding dielectric material ring on a common mount, in accordance with embodiments of the instant invention.

FIG. 17 shows a simplified plan view of two die 80, 82 mounted on a mount 84 together with dielectric material ring 94. Regions between the die 80 and 82 and between the die 80, 82 and the dielectric material ring 94 have been filled with a planarized dielectric layer 96 having a surface that is coplanar with or parallel to surfaces of the die 80 and 82, and dielectric material ring 94. Vias 100 have been formed through the dielectric layer 96, allowing interconnections 98 to be formed on the die 80, 82 to some of the pads 86 associated with the transistors 68 and the passive components 62–66. The interconnections 98 also couple signals between the two die 80, 82 and between the two die 80 and 82 and the mount 84. An exemplary material for the dielectric layer 96 is epoxy. Another exemplary material for the dielectric layer 96 is polyamide. Dielectric layer 96 material can be comprised of polyamide, low temperature deposited glass, dielectric epoxy, a combination of the two or more, or the like.

The interconnections 98 may be formed using conventional techniques and may use geometries that are larger than those typically used in forming integrated circuit die. An example is described in U.S. Pat. No. 5,478,773, entitled "METHOD OF MAKING AN ELECTRONIC DEVICE HAVING AN INTEGRATED INDUCTOR", issued to Stephen Dow, Eric C. Mass, and Bill Marlin, which is incorporated herein by reference for teachings relating to the present invention. In some embodiments, the passive components 62–66 are also formed together with the interconnections 98. In one embodiment, the interconnections 98 are formed from electroplated or electroless gold, or the like, having a thickness of in excess of one micron, using known techniques. Interconnection metal 98 can also be used to form inductor component 62 resulting in an in an inductor having higher Q than is provided by interconnect layers associated with the typical fabrication of IC die 80, 82.

Further processing of the assembly shown in FIG. 17, such as encapsulation or capping to passivate or seal in circuitry and interconnect metalization between die 80, 82 and metalized regions 88 of dielectric material ring 94, should be considered as a completion of the fabrication of the resulting thick film device.

The foregoing detailed description of the instant invention for the purposes of explanation have been particularly directed toward formation of a dielectric platform allowing high Q inductors to be formed on silicon wafers together with transistors and other microelectronic components, and a precision coplanar alignment of more than one die and surrounding coplanar dielectric materials on a common mount.

It will be appreciated that the need for thick, monolithic dielectric films has been described along with methods for meeting that need. A novel low dielectric constant insulator has been described that finds application in RF integrated circuits and in formation of interconnections for high speed digital circuits. The dielectric platform 12 also provides a substantial reduction in noise induced in the substrate 10 and coupled from the substrate 10 to other components due to switching transients. It will be appreciated that improvements in processing techniques may enable formation of dielectric platforms having smaller dimensions and thicknesses than have been described herein without departing from the scope of the appended claims.

Various changes and modifications to the embodiment herein chosen for purposes of illustration will readily occur to those skilled in the art. For example, the depth of the openings in the silicon substrate may be chosen as may be desired for a specific application. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A semiconductor device, comprising:
   a die attach surface having a first pedestal;
   a first semiconductor die having a first surface and an opposed second surface, the first surface being formed with a first cavity mounting the first semiconductor die on the first pedestal and a second smaller cavity within the first cavity underlying a reactive component mounting region defined on the second surface; and
   a reactive component disposed on the second surface of the first semiconductor die within the reactive component mounting region overlying the first pedestal.

2. The semiconductor device of claim 1, where the reactive component includes an inductor.

3. A semiconductor device, comprising:
   a first semiconductor die having a first surface and an opposed second surface, the first surface being formed with a first cavity and a second smaller cavity within the first cavity, the second surface having defined thereon a reactive component mounting region overlying the second cavity and an active component mounting region; a base; and
   a first pedestal formed on a base and engaged with the first cavity, where the first pedestal has a recessed region aligned and in communication with the second cavity for forming a dialectric volume underlying the reactive component mounting region.

4. The semiconductor device of claim 3, further comprising an electrical component disposed on a second surface of the semiconductor die in a region overlying the dielectric volume.

5. The semiconductor device of claim 4, where the electrical component operates as an inductor.

6. The semiconductor device of claim 3, where the dielectric volume comprises a dielectric material.

7. The semiconductor device of claim 6, where the dielectric material is gaseous.

8. The semiconductor device of claim 3, where a surface of the pedestal includes a conductive material for operating as a ground shield of the first semiconductor die.

9. The semiconductor device of claim 3, further comprising:
   a second pedestal disposed on the base; and
   a second semiconductor die having a first surface formed with a cavity for mounting to the second pedestal.

10. The semiconductor device of claim 9, further comprising a dielectric material disposed between the first semiconductor die and the second semiconductor die.

11. The semiconductor device of claim 9, further comprising a conductor disposed for coupling an electrical signal between the first semiconductor die and the second semiconductor die.

12. An integrated circuit, comprising:
   a semiconductor die having a first surface and an opposed second surface, the first surface being formed with a recession, and the second surface being formed with a dielectric platform having a lower surface in the recession and an upper surface defining a reactive component mounting region coplanar with the second surface;
   a die attach base having a raised appurtenance aligned with the recession of the semiconductor die and a recessed region in the raised appurtenance; and
   a reactive component formed on the second surface of the semiconductor die in the reactive component mounting region to overlie the recessed region of the raised appurtenance.

13. A die attach mount, comprising:
   a base having a die mounting surface; and
   a die attach pedestal formed on the die mounting surface and configured to engage with a first semiconductor die having a cooperating recess formed in a rear surface, where the die attach pedestal has a recessed region in a surface thereof for forming a dielectric volume in cooperation with the rear surface of the first semiconductor die.

14. The die attach mount of claim 13, wherein the die attach pedestal comprises a bilaterally symmetrical trapezoidal cross-section and wherein the smallest angles in the cross-section are about 54.73 degrees.

15. The die attach mount of claim 13, wherein the base and the pedestal comprise:
   a generally planar dielectric material forming the base; and
   a frustum of a four-sided pyramid having a broad base coupled to the base.

16. The die attach mount of claim 13, wherein the base and the pedestal comprise:
   a generally planar dielectric material forming the base;
   a frustum of a four-sided pyramid having a broad base coupled to the base, a height of the frustum being configured to be slightly less than a depth of a cavity formed in a rear surface of the semiconductor die.

17. The die attach mount of claim 13, wherein the base and the pedestal comprise:
   a generally planar dielectric material forming the base;
   a frustum of a four-sided pyramid forming the pedestal, the pedestal having a broad base coupled to the base; and
   a conductive coating formed over some exposed surfaces of the base and the pedestal, wherein no conductive coating is present on regions of the pedestal configured to be placed in proximity to one or more dielectric platforms formed on the first semiconductor die, the dielectric platform having a lower surface extending into the first cavity.

18. The die attach mount of claim 13, wherein the base and the pedestal comprise conductive material.

19. The die attach mount of claim 13, wherein the base and the pedestal comprise:
   a generally planar base; and
   a frustum of a four-sided pyramid formed from conductive material and having a broad base coupled to a surface of the generally planar base, a height of the frustum being configured to be slightly greater than a depth of the cooperating cavity formed in the rear surface of the first semiconductor die, the recessed region of the frustum included a small cavity formed on a top surface of the pedestal on regions of the pedestal configured to be placed in proximity to one or more dielectric platforms formed on the first semiconductor die.

* * * * *